United States Patent [19]

Chen

[11] Patent Number: 4,919,971
[45] Date of Patent: Apr. 24, 1990

[54] SELF-INDUCED REPAIRING OF CONDUCTOR LINES

[75] Inventor: Chengjun J. Chen, Yorktown Heights, N.Y.

[73] Assignee: International Business Machines Corporation, Armonk, N.Y.

[21] Appl. No.: 248,889

[22] Filed: Sep. 23, 1988

[51] Int. Cl.⁵ ............................................. B05D 5/12
[52] U.S. Cl. ........................................ 427/98; 427/99; 427/96; 427/49; 427/142; 204/16
[58] Field of Search ................... 427/98, 99, 96, 142, 427/49; 204/16

[56] References Cited

U.S. PATENT DOCUMENTS

| | | | |
|---|---|---|---|
| 2,955,959 | 10/1960 | Du Rose | 427/49 |
| 3,506,545 | 4/1970 | Garwin et al. | 204/15 |
| 3,645,855 | 2/1972 | Wisman | 204/16 |
| 3,833,375 | 9/1974 | Moscony et al. | 96/36.2 |
| 4,103,043 | 7/1978 | Hsieh | 427/49 |
| 4,217,183 | 8/1980 | Melcher et al. | 204/15 |
| 4,239,789 | 12/1980 | Blum et al. | 427/53.1 |
| 4,259,367 | 3/1981 | Dougherty | 427/96 |
| 4,340,617 | 7/1982 | Deutsch et al. | 427/53.1 |
| 4,349,583 | 9/1982 | Kulynych et al. | 427/53.1 |
| 4,383,016 | 5/1983 | Postupack | 427/14.1 |
| 4,403,410 | 9/1983 | Robinson | 29/830 |
| 4,418,264 | 11/1983 | Thorwarth | 219/78.01 |
| 4,496,900 | 1/1985 | DiStefano | 324/51 |
| 4,608,117 | 8/1986 | Ehrlich et al. | 156/610 |
| 4,611,744 | 9/1986 | Fraser | 29/402.18 |
| 4,615,904 | 10/1986 | Ehrlich et al. | 427/38 |
| 4,630,355 | 12/1986 | Johnson | 29/575 |
| 4,704,304 | 11/1987 | Amendola et al. | 427/57 |

OTHER PUBLICATIONS

Applied Phys. Lett., vol. 52, No. 26, pp. 2230-2232, 6/88, "Selective Amplification of Self-Resistively Heated Laser-Direct-Written Tungsten Lines", O. Gottsleben and M. Stuke.

Primary Examiner—Shrive Beck
Assistant Examiner—Vi Duong Dang
Attorney, Agent, or Firm—Aziz M. Ahsan

[57] ABSTRACT

A new method of repairing partially defective conductor lines is disclosed. The defective site comprising narrow necks or thin portions or cracks in a conductor line is heated by passing a relatively high current. Using the thermobattery principle in an electroplating process or an electroless plating process or a pyrolytic deposition process, a conductive material is deposited at the defective site, and the partially defective conductor line is thereby repaired. A method of repairing gaps and circuit opens in a conductor line is also disclosed.

26 Claims, 1 Drawing Sheet

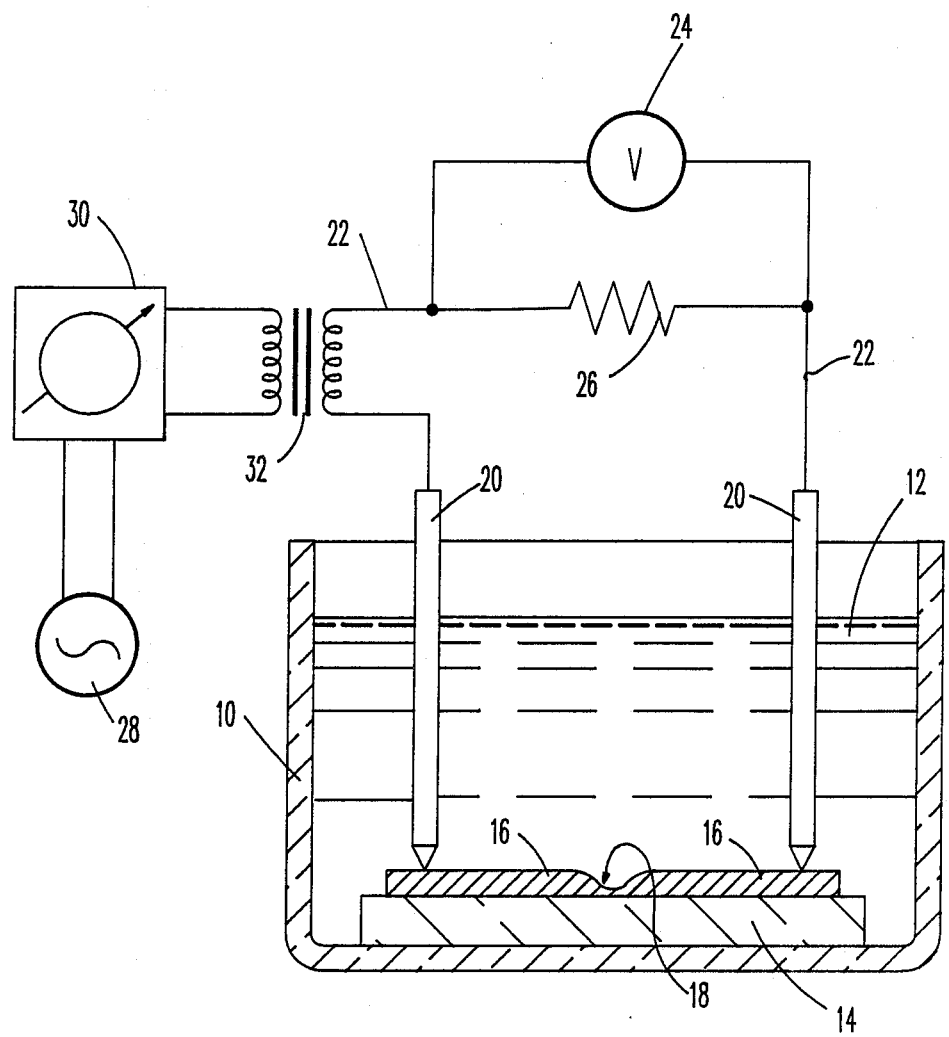

SELF-INDUCED REPAIRING OF CONDUCTOR LINES

FIELD OF THE INVENTION

The present invention relates generally to a new method of repairing conductor lines, and more particularly to conductor lines having narrow necks. The narrow neck or defective portion in the conductor line is heated by passing a high current, and the repairs are made by a deposition process which is induced by the local heat at the defective site. A new method for repairing an open in a conductor line is also disclosed.

BACKGROUND OF THE INVENTION

With the advent of modern day electronics, the circuits on a PCB (Printed Circuit Board) have become more and more dense. This then requires that the conductor lines be thinner or narrower so that more of them can be placed in a given area. Therefore, the probability of the conductor lines having defects increases and each of the PCBs have to be inspected for faults in the conductor lines. This inspection can be done manually or automatically. Once a fault or defect is found, then it has to be located and repaired. Under presently used methods, the fault or defect is visually located by the operator using a microscope and the conductor is repaired manually.

The testing and repairing of the conductor lines on a Printed Circuit Board or ceramic module are among the most critical steps in the packaging technology. This is because the electronic hardware must be reliable and free from defects, as they are very expensive to manufacture and the field failures cannot be repaired easily. To eliminate these immediate and potential defects, tremendous efforts are being made.

Most defects or faults in a conductor line are due to masking or improper deposition of the conductive material. But they could also be related to other factors, such as impure material or stretching the resolution limits of the lithography process. The most commonly found defects are open and narrow necks.

For an open in the conductor line, the repair method currently being used during a mass production process is to visually locate the open and then braze it manually. One such method is disclosed in U.S. Pat. No. 4,418,264, where a specifically shaped metallic part is placed on the conductor path interruption and by means of microresistance welding, the metallic part is welded to the conductor to bridge the interruption. Another method of repairing opens is by decal transfer as disclosed in U.S. Pat. No. 4,704,304.

Laser deposition methods are also being developed for repairing circuit opens. As disclosed in U.S. patent application No. 223,487, filed on July 25, 1988, and presently assigned to IBM, Corp., an open circuit is repaired by laser induced electroplating process based on the thermobattery effect. One tip of the open conductor is heated with a laser beam, and a thermobattery is formed between the hot spot (tip of the conductor) and the cold part (normal section of the conductor). The laser heating of the tip induces the conductive material present in the plating solution to be formed at the hot tip. This process is continued until the growth of the conductive material joins the two open ends of the open, and a continuous electrical path is formed.

However, there are two problems associated with the laser deposition methods. The first is an alignment problem, because the laser beam has to be focused at the site under a microscope, and whether this is done manually or by computer driven processes, both methods are very expensive. The second problem is the laser dosage control. This problem is associated with the fact that the reflectivity of the surface under illumination varies from spot to spot. At some locations it may overheat, and at other locations the heat may not be enough to induce deposition.

For narrow necks and thin portions, more elaborate manipulations are necessary. The repair method currently being used in the industry for the repairs of narrow necks and thin portions is to pass a very strong current pulse (e.g., 50 amperes in 10 micro sec) into each conductor line. The narrow necks or thin portions will burn out by the extreme heat generated there and an open will result. The conductor lines are then visually inspected for circuit opens. The open gaps are then manually cleaned and joined together by methods well known in the art.

Recently non-destructive electrical testing methods (for example, NLC (Nonlinear Conductivity) tester as disclosed in U.S. Pat. No. 4,496,900) have been developed. However, the NLC tester only locates the lines with current constricting defects, such as, cracks, line breaks, intermittent opens, narrow necks, etc., but it does not provide any information as to the exact location of the narrow neck nor does it disclose any method for the repairs of the current constricting defects. Thus, the destructive method as discussed above must still be used. This usage is due to the fact that it is easier to visually locate the burn-outs than untouched defects.

All of the known processes are also very time-and-money consuming. This is because the defective spot has to be visually located and only then can it be repaired. However, the method of this invention is much more efficient. The defective site in the conductor line having a thin portion or a narrow neck does not have to be physically located to initiate the repairs, and the repairs that are made are similar or better than the ones obtained in the prior art. The process of this invention is self-induced, i.e., the passage of the high current creates a hot spot at the defective site and conductive material is induced to be deposited at the defective site. The process of this invention is also self-limiting, i.e., when the defect has been repaired, the process will slow down and stop by itself. The method of this invention also reduces production cost considerably.

SUMMARY OF THE INVENTION

The invention is a novel method for repairing partially defective conductor lines comprising the steps of, heating at least one partially defective site by passing a high current, and, inducing deposition of a conductive material at the partially defective site, thereby repairing the conductor line.

The method of this invention can also be used for repairing a conductor line having at least one open segment by means of a two-step process. First, a conductive connection is made across the open segment. The conductance of that connection can be very low. Then, a high current is passed to heat the conductive connection, and a conductive material is induced to be deposited along the conductive connection, thereby repairing the open segment in the conductor line.

BRIEF DESCRIPTION OF THE DRAWINGS

The FIGURE illustrates a conductor line being repaired by a plating process using the method of the present invention.

DETAILED DESCRIPTION OF THE INVENTION

This invention describes an automatic method of repairing narrow necks or thin portions in conductor lines, without physically locating the narrow necks. Narrow neck or thin portion, as that term is used herein, means a small portion or section of a conductor line which has a higher resistance per unit length than the normal conductor line. The narrow neck can be of a different shape, for example, the narrow neck could be a local reduction in the line width or a local reduction of line height or thickness or a portion of the line may be made of a material with lower conductivity than that of a normal line. The narrow neck could also include a thin electrical connection or a bridge across an open circuit.

It is well known in the art that by passing a relatively high electrical current through a conductor lines in a conductor net, the narrow necks (or a thin section, or a section of the net that has a low conductivity) will be heated up preferentially. This is due to the fact that the narrow portion of a conductor line has a higher value of resistance per length and it generates much more Joule heat than the normal segment. Secondly, as a result of the smaller cross-section of the narrow neck, the heat dissipation is slower.

The above-described local Joule heating phenomenon is also the basis for most of the electrical methods of defect detection, e.g., the NLC tester.

The basic principle of the present invention is to induce metal deposition at the defect site by the Joule heat generated at the defect site.

A series of processes can be used to deposit the conductive material. This series includes gas phase as well as liquid phase deposition processes.

One of the processes used is the electroplating process which utilizes the thermobattery effect. This effect makes the hot site electrically negative (cathode) while the cold parts of the conductor line become positive (anode). The material to be deposited at the defective site or void area is either picked-up from the probes or from the thick part of the conductor line and it migrates towards the defective site. This results in a deposition of the conductive material right at the defective site. The defective site remains negative until the repairs are completed. If the transfer of metal is from the thick part of the conductor line to the defective site, then the line will become more uniform once the deposition process has been completed.

The second process comprises using an electroless plating solution. The material to be deposited is in the plating solution. The plating rate depends sharply on the temperature, for example, at room temperature there is virtually no plating of the electrical conductor unless there is a hot spot and in that case, only the hot spot will be plated. Upon passing the high current, the defective site becomes the hot spot in the conductor line. The hot spot will have a high plating speed while the rest of the conductor line will have no plating. The initially high plating speed at the hot spot will decrease as the defective site or void area is filled with the plating material, and it will decrease and stop once the hot spot is eliminated.

The third process is the self-induced CVD (Chemical Vapour Deposition) process. In this process certain organometallic compounds of conducting material are decomposed by the Joule heat generated at the defective site by the passage of the high current through the line. The conducting material then gets deposited right at the defective site.

In each case, the defective site is plated or covered with a conductive material and the defective conductive line is repaired.

One of the advantages of this invention is that the repairing is self-aligned, i.e., there is no need to locate the defective site or sites, because the electrical current finds wherever there is a defect and heats it up, then the defective spot is automatically plated with a proper amount of the desired material.

The above process is also self-limiting. As the metal is depositing at the defective site or the void area, the cross-sectional area of the defective segment of the conductive line increases. As a result, the local resistance decreases, and the thermal dissipation through the conductive line is improved. The temperature at the defect site decreases. Finally, the deposition process terminates as the cross-sectional area of the defective segment or site has been filled with conducting material, and it is no longer current constrictive.

Since the defective site was repaired using the local Joule effect, the defect signal from an electrical tester (for example, NLC) disappears when the local Joule effect terminates.

When an electroplating solution is used, in order to avoid undesirable migration from one end of a conductor line to the other, an alternating current is preferred. The frequency and the wave shape, however, are probably not critical. Therefore, the most convenient source to use is the 60 Hz commercial power line with the voltage reduced to a few volts.

The relatively high current that is passed through the partially defective conductor line to repair the cracks or narrow necks can be pulsed or modulated. By pulsing the current the deposition process will most probably be slowed down, but the deposition should be uniform. A feedback system could be provided which could insure that the high current which is being passed through the conducting line is always below the current that may damage the conducting line, such as creating an open from a narrow neck.

By combining the process of this invention with laser deposition or other techniques which can form an electrical connection, e.g., a thin bridge, across a circuit open (no matter how poor the conductance is), the circuit open can be repaired as well. The conductive connection that is formed is heated by passing a high current, and once the self-induced deposition process is initiated, it will result in a reliable conducting line.

The deposited conductive material for making an initial connection across the circuit open or gap does not necessarily have to be the same material as in the conductor line.

Similarly, the conductive material that is deposited at the narrow neck or the thin portion does not have to be the same material as the conductor line material. Some of the materials that can be used with this invention are, but not limited to, copper, silver, chromium, aluminum, gold, platinum, molydbenum, tungsten, nickel, palladium and titanium.

The method of this invention is very efficient and cost-effective. It is self-aligned, self-terminating, and provides high quality metal deposition. It can be used to replace the manually operated repairing process currently being used. This method can be combined with the non-destructive electrical test methods to make the testing and repairing of PCB's fully automatic.

By combining the self-induced repairing method with laser induced deposition or other method to make an initial electrical connection, the self-induced repair of opens can also be done.

Since the method of this invention is performed at relatively low temperatures, this method can be used on PCB's made with polymer or other organic materials. PCB's made of ceramic and having a conductor line can also be used.

EXPERIMENTAL SET-UP FOR EXAMPLE 1-4

A series of experiments were performed to demonstrate the new method. The results showed that the principle was valid. In addition, the method was found to be very simple and easy to use.

The samples used to demonstrate the method were printed circuit boards having copper lines. Defects were made on the samples by scratching and etching them with ferric chloride solution. The defects were either narrow necks or thin segments having a defective thickness of approximately 10 to 50 microns.

An IBM NLC tester (See U.S. Pat. No. 4,496,900) was used to characterize the defects. For the samples used the initial reading ranged from 10 micro $V/A^3$ to 10K micro $V/A^3$. After repairing, every single line became normal in the sense that its NLC reading had been reduced to below the detection limit. The visual check showed that the defective spots were well covered up with the conductive material, i.e., copper.

As shown in the FIGURE, two probes or electrodes (20) having conducting wires (22) at one end were attached to a Printed Circuit Board (14). The PCB (14) had a conductor line (16) in which there was a narrow neck or thin portion (18). Not shown but the narrow neck (18) also could include a thin electrical connection or bridge across an open circuit. The PCB (14) with the probes (20) attached was submerged in container (10) containing the plating solution (12). The conducting wires (22) were attached to a voltmeter (24), a one-ohm power resistor (26), and a transformer (32). The current was provided using an A.C. source (28) via a variac (30).

The power source which consisted of a variac (30) and a transformer (32), was connected to a commercial power line (28). The power source provided an AC current up to 7.5 amperes at a few volts. The current was monitored with a voltmeter (24) with a one-ohm power resistor (26) connected in serial with the conductor line (16). The one-ohm resistor (26) was also used to stabilize the current.

Two kinds of plating solutions were used. One was the regular electroplating solution made of one mole of copper sulfate and 0.5 mole sulfuric acid. The other was a commercial EDTA-based (Ethylene Diamino Tetra Acetic acid-based) electroless plating solution manufactured by Enthone, Inc., West Haven, CT., U.S.A.

After the defective site had been repaired, the microstructure of the deposited metal was observed using high-magnification SEM micrographs. The deposited metal appeared crystalline with reasonable grain size, and it was continuous and, it had a dense texture.

EXAMPLE 1

Before the repairs were initiated, the samples were tested with the IBM NLC tester. The defect levels of these samples ranged from 10 micro $V/A^3$ to 10K micro $V/A^3$ in air.

Using the experimental set-up as discussed earlier, the samples were repaired using one mole copper sulfate and 0.5 mole sulfuric acid electroplating solution. Both electrodes (20) had been attached to the conductor line (16) across the narrow neck, as shown in the FIGURE. Upon the passage of the current, a hot spot was generated at the defective site (18), and the current induced the copper to be deposited in the narrow neck region (18). The electroplating process continued until the conductor line became uniform and there was no hot spot. The PCB with the repaired conductor line was removed and cleaned with water to remove the residual electroplating solution.

It was found that different samples exhibited different optimum values of repairing current. The current that initiated a repairing action ranged from about 1 ampere to about 3 amperes. Some samples became open when a four-ampere current was initially passed.

For many samples, 2 amperes was not enough to make a visible effect. However, most of the samples started to show improvement at 3 amperes. By using a current of 4 amperes for a few minutes, all the samples became perfect.

It was also noticed that if the current was too high and the time was too long, some side effects appeared, such as, bubble formation and spike growth of conducting material. By passing a current of 5 amperes for 2 minutes, the defective parts becomes even more uniform. However, bubbles start to emerge at the interface of copper and PCB substrate. Around the bubbles, bell-shaped protrusions start to grow. The deposited copper starts to become porous. The bubbles can be easily removed by proper agitation with, for example, an ultrasonic agitator.

A universal process was found which can repair all the defects without causing any side effects. This process consisted of starting with a low amperes AC current, for example, 1 ampere, and slowly ramping the current up with a speed of 1-2 amperes/minute until it reached 4 amperes to 4.5 amperes which was the maximum tolerable current for this conductor line. The current was allowed to stay at between 4 amperes to 4.5 amperes for about two or three minutes, and then, the system was turned off. Using this method the undesirable side-effects were eliminated.

It was found that all the samples can be repaired to normal lines as indicated by the NLC tester by the above method.

EXAMPLE 2

The experimental set-up as shown in the FIGURE and discussed earlier was used. A partially defective copper wire (16) having a thickness of 50 microns was used which had a thin neck (18). The minimum thickness of the neck was calculated to be much less than 10 microns. The copper wire having the thin neck was subjected to high current which heated the area around the thin neck (18). Electroless plating was performed onto the defective neck using the EDTA-based electroless plating solution manufactured by Enthone, Inc. The electroless plating process was stopped when enough copper had been deposited and there were no hot spots.

The PCB with the repaired conductor line was removed from the container and rinsed with water to remove the plating solution. After the narrow neck had been plated with copper, the NLC readings were taken and they were found to be below the detection limit. After the metal deposition at the defective site, the minimum thickness of the repaired narrow neck was calculated to be over 40 microns.

Both, the electroplating process and the electroless process produced similar results. The speed of repairing in the electroless plating process was slower than the electroplating process by a factor of about two.

EXAMPLE 3

The experimental set-up as shown in the FIGURE and discussed earlier was used. A partially defective copper line (16) with a crack was repaired. Before the repair, an obvious crack existed. The NLC reading was 300 micro $V/A^3$ which showed a serious defect. The copper line was subjected to a high current and the area around the crack was plated using the electroplating process, and the crack became filled with copper. Upon visual inspection, it was noticed that the whole area around the crack was covered with a thick deposit of copper. The NLC readings were then taken, and the readings this time were below the detection limit.

EXAMPLE 4

The experimental set-up similar to the one in Example 3 was used except the partially defective copper line with a crack was subjected to an electroless process. The high current heated the area around the crack and the crack became filled with copper. Upon visual inspection, it was noticed that the whole area around the crack was covered with a thick deposit of copper. The NLC readings were then taken, and the readings this time were below the detection limit.

EXAMPLE 5

A gas chamber is filled with saturated vapor of triethylphosphine cyclopentadienyl copper and a copper line having a defective site is placed in the gas chamber. By slowly increasing the current from 1 ampere to 5 amperes in the copper line a hot spot is created at the defective site, the copper is induced to be deposited on to the defective site through a gas-phase pyrolysis process or the self-induced Chemical Vapor Deposition process.

While the present invention has been particularly described, it will be understood by those skilled in the art that the foregoing and other changes in form and detail may be made therein without departing from the spirit and the scope of the present invention.

What is claimed is:

1. A method for repairing partially defective conductor lines, wherein said defect is formed by thinning of a portion of said line, comprising the steps of,
   selectively heating at least one partially defective site in said conductor line by passing a high current, and,
   inducing deposition of a conductive material at said partially defective site, thereby repairing said conductor line.

2. The method of claim 1 wherein the conductive material is selected from the group comprising nickel, copper, silver, chromium, aluminum, gold, platinum, palladium, molybdenum, tungsten and titanium.

3. The method of claim 1 wherein said conductive material is deposited using an electroplating process.

4. The method of claim 1 wherein said conductive material is deposited using an electroless plating process.

5. The method of claim 1 wherein said conductive material is deposited using a gas phase pyrolysis process.

6. The method of claim 1 wherein the partially defective conductor line is on a printed circuit board.

7. The method of claim 1 wherein the partially defective conductor line is on a ceramic material.

8. The method of claim 1 wherein the partially defective conductor line is on a polymeric material.

9. The method of claim 1 wherein the defective site is a narrow neck in said defective conductor line.

10. The method of claim 1 wherein the defective site is a crack in said defective conductor line.

11. The method of claim 1 wherein the high current is pulsed, modulated, an alternating current or a direct current.

12. The method of claim 1 wherein the high current is below the current which may damage said partially defective conductor line.

13. The method of claim 1 wherein said high current is started with a relatively low current, said current is increased slowly until it reaches the maximum tolerable current for said conductor line, and said high current is then terminated after said partially defective site has been repaired.

14. The method of claim 1 wherein the deposition of conductive material is terminated when the cross-sectional area of the defective site is equal to the cross-sectional area of the conductor line.

15. A method for repairing a conductor line having at least one open segment comprising the steps of,
    forming a conductive connection across said open segment,
    selectively heating said conductive connection by passing a high current, and
    inducing the deposition of a conductive material along said conductive connection thereby repairing said open segment in said conductor line.

16. The method of claim 15 wherein the conductive material is selected from the group comprising nickel, copper, silver, chromium, aluminum, gold, palladium, platinum, molybdenum, tungsten and titanium.

17. The method of claim 15 wherein said conductive material is deposited using an electroplating process.

18. The method of claim 15 wherein said conductive material is deposited using an electroless process.

19. The method of claim 15 wherein said conductive material is deposited using a gas phase pyrolysis process.

20. The method of claim 15 wherein the conductor line having an open segment is on a printed circuit board.

21. The method of claim 15 wherein the conductor line having an open segment is on a ceramic material.

22. The method of claim 15 wherein the conductor line having an open segment is on a polymer material.

23. The method of claim 15 wherein the high current is pulsed, modulated, an alternating current or a direct current.

24. The method of claim 15 wherein the high current is below the current which may damage said conductor line.

25. The method of claim 15 wherein said high current is started with a relatively low current, said current is increased slowly until it reaches the maximum tolerable current for said conductor line, and said high current is then terminated after said partially defective site has been repaired.

26. The method of claim 15 wherein the deposition of conductive material is terminated when the cross-sectional area of the open segment filled with said conductive material is equal to the cross-sectional area of the conductor line.

* * * * *